United States Patent [19]

Van Rompuy et al.

[11] Patent Number: 5,597,676
[45] Date of Patent: Jan. 28, 1997

[54] METHOD FOR MAKING IMPROVED IMAGING ELEMENTS SUITABLE FOR USE IN SILVER SALT DIFFUSION TRANSFER PROCESS

[75] Inventors: Ludo Van Rompuy, Destelbergen; Paul Coppens, Turnhout, both of Belgium

[73] Assignee: AGFA-Gevaert. N.V., Mortsel, Belgium

[21] Appl. No.: 516,108

[22] Filed: Aug. 17, 1995

[30] Foreign Application Priority Data

Sep. 8, 1994 [EP] European Pat. Off. ............. 94202575

[51] Int. Cl.$^6$ ............... G03C 8/06; G03C 8/28; G03C 11/12; G03F 7/07
[52] U.S. Cl. ............... 430/204; 430/227; 430/230; 430/256; 430/259; 430/262; 430/263
[58] Field of Search ............... 430/204, 230, 430/227, 259, 263, 256

[56] References Cited

U.S. PATENT DOCUMENTS

| | | | |
|---|---|---|---|
| 5,068,165 | 11/1991 | Coppens et al. | 430/204 |
| 5,270,147 | 12/1993 | Van Thillo et al. | 430/262 |
| 5,273,858 | 12/1993 | Coppens et al. | 430/204 |
| 5,427,889 | 6/1995 | Saikawa et al. | 430/204 |

*Primary Examiner*—Richard L. Schilling
*Attorney, Agent, or Firm*—Breiner & Breiner

[57] ABSTRACT

The present invention provides a method for obtaining an imaging element suitable for use in a silver salt diffusion transfer process by the steps of:

preparing an image receiving element by coating the anodized surface of an aluminum foil with an image-receiving layer comprising physical development nuclei, preparing a photosensitive layer packet by coating a temporary base with at least one photosensitive silver halide emulsion layer, pressing the thus formed photosensitive layer packet with its photosensitive silver halide emulsion coated side against said image receiving layer, which has been wet with an aqueous moistening liquid, and optionally removing said temporary base, characterized in that between said temporary base and said at least one photosensitive silver halide emulsion layer a barrier layer is present which is substantially free of developing agents, is substantially unhardened, comprises one or more hydrophilic binders in an amount of at least 0.25 g/m$^2$ and is in water permeable relationship with said image receiving layer.

7 Claims, No Drawings

METHOD FOR MAKING IMPROVED IMAGING ELEMENTS SUITABLE FOR USE IN SILVER SALT DIFFUSION TRANSFER PROCESS

DESCRIPTION

1. Field of the Invention.

The present invention relates to a method for making improved imaging elements suitable for use in the silver salt diffusion transfer process.

2. Background of the Invention.

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background.

The DTR-image can be formed in the image receiving layer of a sheet or web material which is a separate element with respect to the photographic silver halide emulsion material (a so-called two-sheet DTR element) or in the image receiving layer of a so-called single-support-element, also called mono-sheet element, which contains at least one photographic silver halide emulsion layer integral with an image receiving layer in waterpermeable relationship therewith. It is the latter mono-sheet version which is preferred for the preparation of offset printing plates by The DTR method.

Two types of the mono-sheet DTR offset printing plate exist. According to a first type disclosed in e.g. U.S. Pat. No. 4,722,535 and GB-1,241,661 a support is provided in the order given with a silver halide emulsion layer and a layer containing physical development nuclei serving as the image-receiving layer. After information-wise exposure and development the imaged element is used as a printing plate without the removal of the emulsion layer.

According to a second type of mono-sheet DTR offset printing plate a hydrophilic surface of a support, mostly anodized aluminum, is provided in the order given with an image-receiving layer comprising physical development nuclei and a silver halide emulsion layer. After information-wise exposure and development the imaged element is treated to remove the emulsion layer so that a support carrying a silver image is left which is used as a printing plate. Such type of lithographic printing plate is disclosed e.g. in U.S. Pat. No. 3,511,656.

When the hydrophilic surface of the support of the above mentioned imaging element consist of anodized aluminum said imaging element can be prepared by coating the different layers on the anodized hydrophilic surface of an aluminum foil support. Alternatively the above mentioned imaging element may be prepared by laminating the silver halide emulsion layer and possible optional layers to said image receiving layer from a temporary base holding the layers in reverse order as disclosed in U.S. Pat. Nos. 5,068,165 and 5,273,858.

However, it has been found that after said lamination a certain amount of the emulsion layer is retained on the temporary base, resulting in an imaging element with less silver halide emulsion and thus a lower sensitivity and lower silver yield after development than expected. When the emulsion layer and/or possible optional layers contain developing agents e.g. for preparing a material suitable for development by an activating solution and so avoiding the necessity of the use of a developing solution, up to the greater amount of the emulsion layer can be retained on the temporary base.

3. Summary of the Invention.

It is an object of the present invention to provide a method for obtaining an imaging element suitable for use in a silver salt diffusion transfer process by laminating the emulsion layer and possible optional layers from a temporary base to the image receiving layer with an improved yield of emulsion layer transfer.

It is a further object of the present invention to provide a method for obtaining a lithographic printing plate of good printing properties according to the silver salt diffusion transfer process by using said imaging element.

Further objects of the present invention will become clear from the description hereinafter.

According to the present invention there is provided a method for obtaining an imaging element suitable for use in a silver salt diffusion transfer process by the steps of:

preparing an image receiving element by coating the anodized surface of an aluminum foil with an image-receiving layer comprising physical development nuclei, preparing a photosensitive layer packet by coating a temporary base with at least one photosensitive silver halide emulsion layer, pressing the thus formed photosensitive layer packet with its photosensitive silver halide emulsion coated side against said image receiving layer, which has been wet with an aqueous moistening liquid; and optionally removing said temporary base, characterized in that between said temporary base and said at least one photosensitive silver halide emulsion layer a barrier layer is present which is substantially free of developing agents, is substantially unhardened, comprises one or more hydrophilic binders in an amount of at least 0.25 g/m² and is in water permeable relationship with said image receiving layer.

According to the present invention there is also provided a method for obtaining a lithographic printing plate according to the silver salt diffusion transfer process comprising the steps of:

image-wise exposing an imaging element as described above, applying an aqueous alkaline solution to the imaging element in the presence of (a) developing agent(s) and (a) silver halide solvent(s) to form a silver image in said image receiving layer, treating the imaging element to remove the layers on top of said image receiving layer, thereby exposing the imaged surface of the support by uncovering said silver image formed in said image receiving layer.

4. Detailed Description of the Invention.

According to the present invention it has been found that when laminating a silver halide emulsion layer and other optional layers to the above mentioned image receiving layer from a temporary base practically no emulsion layer is retained on the temporary base, resulting in an imaging element with a higher amount of silver halide emulsion, a better sensitivity and an increased silver yield after development if between said temporary base and said silver halide emulsion layer a barrier layer as described above is applied.

According to the present invention said barrier layer is substantially free of developing agents, i.e. contains less than 0.1 g/m$^2$ of developing agents. Preferably said barrier layer contains less than 0.05 g/m$^2$, more preferably less than 0.01 g/m$^2$ of developing agents.

The barrier layer according to the invention is substantially unhardened. Substantially unhardened means that when the imaging element, after having been dried for 3 days at 57° C. and 35% R.H. is dipped in water of 35° C., said layer is dissolved for more than 95% by weight within 5 minutes.

The barrier layer according to the invention comprises one or more hydrophilic binders in an amount of at least 0.25 g/m$^2$, preferably in an amount of at least 0.5 g/m$^2$, more preferably in an amount of at least 1.0 g/m$^2$. Said barrier layer preferably comprises hydrophilic binders in an amount of not more than 10 g/m$^2$, more preferably in an amount of not more than 5 g/m$^2$ but the maximum amount of hydrophilic binder(s) in said barrier layer is not critical.

The barrier layer according to the invention has to be in water permeable relationship with said image receiving layer in the imaging element. Layers being in waterpermeable contact with each other are layers that are contiguous to each other or only separated from each other by (a) waterpermeable layer(s). The nature of a waterpermeable layer is such that it does not substantially inhibit or restrain the diffusion of water or of compounds contained in an aqueous solution e.g. developing agents or the complexed silver.

The aluminum support of the imaging element for use in accordance with the present invention can be made of pure aluminum or of an aluminum alloy, the aluminum content of which is at least 95%. The thickness of the support usually ranges from about 0.13 to about 0.50 mm.

The preparation of aluminum or aluminum alloy foils for lithographic offset printing comprises the following steps: graining, anodizing, and optionally post-treating of the foil. Preferably the aluminum foil has a roughness with a CLA value between 0.2 and 1.5 µm, an anodization layer with a thickness between 0.4 and 2.0 µm and is post-treated with an aqueous bicarbonate solution.

According to the present invention the roughening of the aluminum foil can be performed according to the methods well known in the prior art. The surface of the aluminum substrate can be roughened either by mechanical, chemical or electrochemical graining or by a combination of these to obtain a satisfactory adhesiveness of a silver halide emulsion layer to the aluminum support and to provide a good water retention property to the areas that will form the non-printing areas on the plate surface.

The electrochemical graining process is preferred because it can form a uniform surface roughness having a large average surface area with a very fine and even grain which is commonly desired when used for lithographic printing plates.

Electrochemical graining can be conducted in a hydrochloric and/or nitric acid containing electrolyte solution using an alternating or direct current. Other aqueous solutions that can be used in the electrochemical graining are e.g. acids like HCl, HNO$_3$, H$_2$SO$_4$, H$_3$PO$_4$, that if desired, contain additionally one or more corrosion inhibitors such as Al(NO$_3$)$_3$, AlCl$_3$, boric acid, chromic acid, sulfates, chlorides, nitrates, monoamines, diamines, aldehydes, phosphates, H$_2$O$_2$, etc. . . .

Electrochemical graining in connection with the present invention can be performed using single-phase and three-phase alternating current. The voltage applied to the aluminum plate is preferably 10–35 V. A current density of 3–150 Amp/dm$^2$ is employed for 5–240 seconds. The temperature of the electrolytic graining solution may vary from 5–50° C. Electrochemical graining is carried out preferably with an alternating current from 10 Hz to 300 Hz.

The roughening is preferably preceded by a degreasing treatment mainly for removing fatty substances from the surface of the aluminum foil.

Therefore the aluminum foil may be subjected to a degreasing treatment with a surfactant and/or an aqueous alkaline solution.

Preferably roughening is followed by a chemical etching step using an aqueous solution containing an acid. The chemical etching is preferably carried out at a temperature of at least 30° C. more preferably at least 40° C. and most preferably at least 50° C.

Suitable acids for use in the aqueous etch solution are preferably inorganic acids and most preferably strong acids. The total amount of acid in the aqueous etch solution is preferably at least 150 g/l. The duration of chemical etching is preferably between 3s and 5 min.

After roughening and optional chemical etching the aluminum foil is anodized which may be carried out as follows.

An electric current is passed through the grained aluminum foil immersed as an anode in a solution containing sulfuric acid, phosphoric acid, oxalic acid, chromic acid or organic acids such as sulfamic, benzosulfonic acid, etc. or mixtures thereof. An electrolyte concentration from 1 to 70% by weight can be used within a temperature range from 0°–70° C. The anodic current density may vary from 1–50 A/dm$^2$ and a voltage within the range 1–100 V to obtain an anodized film weight of 1–8 g/m$^2$ Al$_2$O$_3$.$_2$O. The anodized aluminum foil may subsequently be rinsed with demineralised water within a temperature range of 10°–80° C.

After the anodizing step a posttreatment such as sealing may be applied to the anodic surface. Sealing of the pores of the aluminum oxide layer formed by anodization is a technique known to those skilled in the art of aluminum anodization. This technique has been described in e.g. the "Belgisch-Nederlands tijdschrift voor Oppervlaktetechnieken van materialen", 24ste jaargang/januari 1980, under the title "Sealing-kwaliteit en sealing-controle van geanodiseerd Aluminum". Different types of sealing of the porous anodized aluminum surface exist.

A preferred posttreatment is performed by treating a grained and anodized aluminum support with an aqueous solution containing a bicarbonate as disclosed in EP-A 567178, which therefor is incorporated herein by reference.

Preferably each of the above described steps is separated by a rinsing step to avoid contamination of the liquid used in a particular step with that of the preceding step.

To promote the image sharpness and, as a consequence thereof, The sharpness of the final printed copy, the anodization layer may be coloured in the mass with an antihalation dye or pigment e.g. as described in JA-Pu-58-14,797.

Subsequent to the preparation of the grained and anodized surface of the aluminum support as described above said surface may be immediately coated with a solution containing the physical development nuclei or may be coated with said solution at a later stage.

The image receiving layer for use in accordance with the present invention is preferably free of hydrophilic binder but may comprise small amounts up to 30% by weight of the total weight of said layer of a hydrophilic colloid e.g. polyvinyl alcohol to improve the hydrophilicity of the layer.

Preferred development nuclei for use in accordance with the present invention are sulphides of heavy metals e.g. sulphides of antimony, bismuth, cadmium, cobalt, lead, nickel, palladium, platinum, silver, and zinc. Other suitable development nuclei are heavy metal salts such as e.g. selenides, polyselenides, polysulphides, mercaptans, and tin (II) halides. Heavy metals, preferably silver, gold, platinum, palladium, and mercury can be used in colloidal form. More preferred development nuclei for use in accordance with the present invention are nuclei, especially sulphides of heavy metals having an average diameter less than 6 nm and wherein the number of nuclei having a diameter larger than 4.5 nm is less than 15% of the total number of nuclei contained in said image receiving layer as disclosed in EP-A 546.598. Especially preferred development nuclei in connection with the present invention are palladium sulphide nuclei having an average diameter less than 6 nm and wherein the number of nuclei having a diameter larger than 4.5 nm is less than 15% of the total number of nuclei contained in said image receiving layer.

To promote the image sharpness the grained and anodized surface of the aluminum support can be provided with a very thin antihalation coating of a dye or pigment or the image receiving layer may incorporate at least one antihalation dye or pigment.

The temporary base, whereon is coated the barrier layer in accordance with the invention is preferably a cellulose triacetate or polyethylene terephtalate film base coated with a subbing layer with a weak adhesion for a hydrophilic layer. Such subbing layer preferably comprises a copolymer containing water-soluble monomers and water-insoluble monomers in a molar ratio between 1:99 and 20:80. An example of an especially preferrred copolymer for use in said subbing layer is a copolymer of crotonic acid and vinylacetate in a molar ratio between 2:98 and 10:90.

The photosensitive layer coated on the barrier layer in accordance with the present invention may be any layer comprising a hydrophilic colloid binder and at least one photosensitive silver halide emulsion.

The photographic silver halide emulsion(s) used in accordance with the present invention can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

For use according to the present invention the silver halide emulsion or emulsions preferably consist principally of silver chloride while a fraction of silver bromide may be present ranging from 1 mole % to 40 mole %. Most preferably a silver halide emulsion containing at least 70 mole % of silver chloride is used.

The average size of the silver halide grains may range from 0.10 to 0.70 µm, preferably from 0.25 to 0.45 µm.

Preferably during the precipitation stage iridium and/or rhodium containing compounds or a mixture of both are added. The concentration of these added compounds ranges from $10^{-8}$ to $10^{-3}$ mole per mole of $AgNO_3$, preferably between $0.5*10^{-7}$ and $10^{-5}$ mole per mole of $AgNO_3$.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-A-493,464 and 568,687, and polyamines such as diethylene triamine or derivatives of aminoethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. Koslowsky, Z. Wiss. Photogr. Photophys. Photochem. 46, 65–72 (1951).

The emulsions of the DTR element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

In the case of a conventional light source, e.g. tungsten light, a green sensitizing dye is needed. In case of exposure by an argon ion laser a blue sensizing dye is incorporated. In case of exposure by a red light emitting source, e.g. a LED or a HeNe laser a red sensitizing dye is used. In case of exposure by a semiconductor laser special spectral sensitizing dyes suited for the near infra-red are required. Suitable infra-red sensitizing dyes are disclosed in i.a. U.S. Pat. Nos. 2,095,854, 2,095,856, 2,955,939, 3,482,978, 3,552,974, 3,573,921, 3,582,344, 3,623,881 and 3,695.888.

A preferred blue sensitizing dye, green sensitizing dye, red sensitizing dye and infra-red sensitizing dye in connection with the present invention are described in EP-A 554,585.

To enhance the sensitivity in the red or near infra-red region use can be made of so-called supersensitizers in combination with red or infra-red sensitizing dyes. Suitable supersensitizers are described in Research Disclosure Vol 289, May 1988, item 28952. The spectral sensitizers can be added to the photographic emulsions in the form of an aqueous solution, a solution in an organic solvent or in the form of a dispersion.

The silver halide emulsions may contain the usual emulsion stabilizers. Suitable emulsion stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable emulsion stabilizers are i.a. heterocyclic mercapto compounds.

As binder in the barrier layer and in the silver halide emulsion layer(s) in connection with the present invention a hydrophilic colloid may be used, usually a protein, preferably gelatin. Mixtures of different gelatins with different viscosities can be used to adjust the theological properties of the layer. Gelatin can, however, be replaced in part or totally by synthetic, semi-synthetic, or natural polymers. e.g. albumin, casein, zein, polyvinyl alcohol, alginic acids or salts thereof, cellulose derivatives such as carboxymethyl cellulose, modified gelatin, e.g. phthaloyl gelatin etc. Preferably, the silver halide emulsion layer contains gelatin whereof a 10% by weight aqueous solution at 36° C. and pH 6 has a viscosity lower than 20 mPa.s at a shearing rate of 1000 s$^{-1}$, measured with a viscosimeter operating with a rotating cylinder and marketed under the tradename HAAKE ROTOVISCO rheometer Type M 10, wherein the cylinder can be rotated at 1000 rpm and a maximal shearing rate of 44,500 s$^{-1}$. Said low viscosity gelatin is preferably combined with a gelatin of a higher viscosity. The weight ratio of said low viscosity gelatin versus the gelatin of a higher viscosity is preferably more than 0.5.

Preferably the gelatin layer(s) is(are) substantially unhardened as defined before.

The silver halide emulsions may contain pH controlling ingredients. Preferably at least one gelatin containing layer is coated at a pH value not below the iso-electric point of the gelatin to avoid interactions between said gelatin containing coated layer and the hereafter mentioned intermediate layer. More preferably the gelatin layer contiguous to said intermediate layer is coated at a pH value not below the iso-electric point of the gelatin. Most preferably all the gelatin containing layers are coated at a pH value not below the iso-electric point of their gelatin. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. No. 4,092,168, U.S. Pat. No. 4,311,787 and DE-P 2,453,217.

More details about the composition, preparation and coating of silver halide emulsions suitable for use in accordance with the present invention can be found in e.g. Product Licensing Index, Vol. 92, December 1971, publication 9232, p. 107–109.

Preferably, there is coated as upper layer of the photosensitive layer packet an intermediate layer to facilate the removal of said layer(packet) thereby uncovering the silver image formed in the image receiving layer by processing the imaging element.

In one embodiment, the intermediate layer is a water-swellable intermediate layer coated at a ratio of 0.01 to 2.0 g/m2 and comprising at least one non-proteinic hydrophilic film-forming polymer e.g. polyvinyl alcohol and optionally comprising an antihalation dye or pigment as disclosed in EP-A-410500.

In another embodiment, the intermediate layer is a layer comprising hydrophobic polymer beads having an average diameter not lower than 0.2 μm and having been prepared by polymerization of at least one ethylenically unsaturated monomer. Preferably, said intermediate layer in dry condition comprises said hydrophobic polymer beads in an amount of up to 80% of its total weight. Further details are disclosed in EP-A-483415.

A supplemental intermediate layer, which may be present between said silver halide emulsion layer and said water-swellable intermediate layer or said intermediate layer comprising hydrophobic polymer beads may incorporate one or more ingredients such as i.a. antihalation dyes or pigment, developing agents, silver halide solvents, base precursors, and anticorrosion substances.

The following steps in the preparation of the imaging element consist in pressing the thus formed photosensitive layer packet with its upper layer, being the photosensitive silver halide emulsion layer or an intermediate layer against said image receiving layer on the anodized surface of the aluminum foil, which last layer has been wet with an aqueous moistening liquid and optionally drying the thus obtained photosensitive monosheet layer assemblage supported by said aluminum foil before or after the optional removal of said temporary base. In a preferred embodiment of the preparation of the imaging element, said temporary base is stripped off.

According to the present invention the imaging element can be information-wise exposed in an apparatus according to its particular application. A wide choice of cameras for exposing the photosensitive silver halide emulsion exists on the market. Horizontal, vertical and darkroom type cameras and contact-exposure apparatus are available to suit any particular class of reprographic work. The imaging element in accordance with the present invention can also be exposed with the aid of i.a. laser recorders and cathode rays tubes.

The development and diffusion transfer of the information-wise exposed imaging element in order to form a silver image in said photosensitive layer and to allow unreduced silver halide or complexes formed thereof to diffuse image-wise from the photosensitive layer to said image receiving layer to produce therein a silver image, are effected with the aid of an aqueous alkaline solution in the presence of at least one developing agent and at least one silver halide solvent said alkaline solution preferably comprising a silver halide solvent.

The temporary base has to be stripped off from the monosheet layer assemblage before the start of the processing of the exposed imaging element and is, as said before, preferably stripped off before the exposure of said imaging element.

The developing agent(s) and/or the silver halide solvent(s) can be incorporated in the aqueous alkaline solution and/or in the imaging element itself e.g. in at least one silver halide emulsion layer and/or in a water-swellable layer and/or in a supplemental hydrophilic colloid layer in water-permeable relationship with the silver halide emulsion layer(s). The silver halide solvent can also be incorporated at least in part in the physical development nuclei containing layer.

The developing agent(s) are preferably at least partly incorporated in the imaging element itself. When the aqueous alkaline solution does not comprise a developing agent, it is merely an activating liquid that is capable of dissolving the developing agent(s) contained in one or more of the layers.

Suitable developing agents for use in accordance with the present invention are a hydroquinone-type compound in combination with a secondary developing agent of the class of 1-phenyl-3-pyrazolidinone compounds and p-N-methyl-aminophenol. Particularly useful 1-phenyl-3-pyrazolidinone developing agents are 1-phenyl-3-pyrazolidinone, 1-phenyl-4-methyl-3-pyrazolidinone and 1-phenyl-4,4-dimethyl-3-pyrazolidinone. Preferred phenidone type developing agents, particularly when they are incorporated into the photographic material are phenidones of which the aqueous solubility is increased by a hydrophilic substituent such as e.g. hydroxy, amino, carboxylic acid group, sulphonic acid group etc. Examples of phenidones subsituted with one or more hydrophilic groups are e.g. 1-phenyl-4,4-dimethyl-2-hydroxymethyl-3-pyrazolidone, 1-(4-carboxyphenyl)-4,4-dimethyl-3-pyrazolidone, 1-phenyl-4-methyl-4-hydroxymethyl-3-pyrazolidone etc. However other developing agents can be used.

The hydroquinone-type compound is e.g. hydroquinone, methyl-hydroquinone, or chlorohydroquinone. In a developing solution preferred amounts of the hydroquinone-type developing agents are in the range of 0.05 mole to 0.25 mole per litre and preferred amounts of secondary developing agent(s) in the range of $1.8 \times 10^{-3}$ to $2.0 \times 10^{-2}$ mole per litre.

When the developing agents are incorporated in the imaging element preferred amounts of the hydroquinone-type developing agents are in the range of 1.5 mmole/m$^2$ to 7.5 mmole/m$^2$ and preferred amounts of secondary developing agent(s) in the range of 0.5 mmole/m$^2$ to 2.5 mmole/m$^2$.

The silver halide solvent(s) can be incorporated in the aqueous alkaline solution and/or in the imaging element itself e.g. in at least one silver halide emulsion layer and/or in an intermediate layer and/or in a supplemental hydrophilic colloid layer in water-permeable relationship with the silver halide emulsion layer(s). The silver halide solvent can also be incorporated at least in part in the physical development nuclei containing layer.

The silver halide solvent, which acts as a complexing agent for silver halide, preferably is a water-soluble thiosulphate or thiocyanate e.g. sodium, potassium, or ammonium thiosulphate or thiocyanate in an amount ranging from 5 g to 20 g per liter.

Further silver halide solvents that can be used in connection with the present invention are e.g. sulphite, amines, 2-mercaptobenzoic acid, cyclic imide compounds such as e.g. uracil, 5,5-dialkylhydantoins, alkyl sulfones and oxazolidones.

Further silver halide solvents for use in connection with the present invention are alkanolamines. Examples of alkanolamines that may be used in connection with the present invention correspond to the following formula:

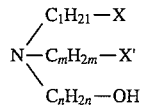

wherein X and X' independently represent hydrogen, a hydroxyl group or an amino group, 1 and m represent 0 or integers of 1 or more and n represents an integer of 1 or more. Said alkanolamines may be present in the alkaline processing liquid in a concentration preferably between 0.1% and 5% by weight. However part or all of the alkanolamine can be present in one or more layers of the imaging element.

Still other preferred further silver halide solvents for use in connection with the present invention are thioethers. Preferably used thioethers correspond to the following general formula:

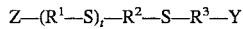

wherein Z and Y each independently represents hydrogen, an alkyl group, an amino group, an ammonium group, a hydroxyl, a sulfo group, a carboxyl, an aminocarbonyl or an aminosulfonyl, $R^1$, $R^2$ and $R^3$ each independently represents an alkylene that may be substituted and optionally contain an oxygen bridge and t represents an integer from 0 to 10. Examples of thioether compounds corresponding to the above formula are disclosed in e.g. U.S. Pat. No. 4.960.683 and EP-A 554,585.

Still further suitable silver halide solvents are 1,2,4-triazolium-3-thiolates, preferably in combination with alkanolamines.

Combinations of different silver halide solvents can be used and it is also possible to incorporate at least one silver halide solvent into a suitable layer of the imaging element and to add at least one other silver halide solvent to the developing solution.

The aqueous alkaline solution in accordance with the present invention may further comprise sulphite e.g. sodium sulphite in an amount ranging from 40 g to 180 g per liter, preferably from 60 to 160 g per liter in combination with another silver halide solvent.

The aqueous alkaline solution suitable for use according to the present invention preferably comprises aluminum ions in an amount of at least 0.3 g/l, more preferably in an amount of at least 0.6 g/1 in order to prevent sticking of the emulsion layer to the transporting rollers when the emulsion is swollen with the aqueous alkaline solution.

The alkaline processing liquid preferably has a pH between 9 and 14 and more preferably between 10 and 13, but depends on the type of silver halide emulsion material to be developed, intended development time, and processing temperature.

The processing conditions such as temperature and time may vary within broad ranges provided the mechanical strength of the materials to be processed is not adversely influenced and no decomposition takes place.

The pH of the alkaline processing liquid may be established by an organic or inorganic alkaline substance or a combination thereof. Suitable inorganic alkaline substances are e.g. hydroxides of sodium and potassium, alkali metal salts of phosphoric acid and/or silicic acid e.g. trisodium phosphate, orthosilicates, metasilicates, hydrodisilicates of sodium or potassium, and sodium carbonate etc. Suitable organic alkaline substances are e.g. alkanolamines. In the latter case the alkanolamines will provide or help providing the pH and serve as a silver halide complexing agent.

The aqueous alkaline solution may further comprise hydrophobizing agents for improving the hydrophobicity of the silver image obtained in the image image receiving layer. Generally these compounds contain a mercapto group or thiolate group and one or more hydrophobic substituents. Particularly preferred hydrophobizing agents are mercapto-1,3,4-thiadiazoles as described in DE-A 1,228,927 and in U.S. Pat. No. 4,563,410, 2-mercapto-5-heptyl-oxa-3, 4-diazole and long chain (at least 5 carbon atoms) alkyl substituted mercaptotetrazoles. The hydrophobizing agents can be used alone or in combination with each other.

These hydrophobizing compounds can be added to the aqueous alkaline solution in an amount of preferably 0.1 to 3 g per litre and preferably in admixture with 1-phenyl-5-mercaptotetrazole, the latter compound may be used in amounts of e.g. 50 mg to 1.2 g per litre of solution, which may contain a minor amount of ethanol to improve the dissolution of said compounds.

The aqueous alkaline solution may comprise other ingredients such as e.g. oxidation preservatives, a compound releasing bromide ions, calcium-sequestering compounds, anti-sludge agents, and hardeners including latent hardeners.

Regeneration of the aqueous alkaline solution according to known methods is, of course, possible, whether the solution incorporates developing agent(s) and/or silver halide solvent(s) or not.

The development may be stopped—though this is often not necessary—with a so-called stabilization liquid, which actually is an acidic stop-bath having a pH preferably in the range of 5 to 6.

Bufferred stop bath compositions comprising a mixture of sodium dihydrogen orthophosphate and disodium hydrogen orthophosphate and having a pH in said range are preferred.

The development and diffusion transfer can be initiated in different ways e.g. by rubbing with a roller, by wiping with an absorbent means e.g. with a plug of cotton or sponge, or by dipping the material to be treated in the liquid composition. Preferably, they proceed in an automatically operated apparatus. They are normally carried out at a temperature in the range of 18° C. to 30° C.

After formation of the silver image on the hydrophilic base an excess of alkaline solution still present on the base may be eliminated, preferably by guiding the foil through a pair of squeezing rollers.

The silver image thus obtained in the layer of physical development nuclei is subsequently uncovered by treating the imaging element to remove all the layers above the layer containing physical development nuclei, thereby exposing the imaged surface of the hydrophilic support.

According to a particularly preferred embodiment of the present invention the silver image in the layer of physical development nuclei is uncovered by washing off all the layers above the layer containing physical development nuclei with rinsing water.

The temperature of the rinsing water may be varied widely but is preferably between 30° C. and 50° C., more preferably between 35° C. and 45° C.

Preferably said exposed imaged surface of the hydrophilic support is treated with a finisher to enhance the water-receptivity of the non-image areas and to make the image areas oleophilic ink-receptive.

The lithographic composition often called finisher comprises at least one compound enhancing the ink-receptivity and/or lacquer-receptivity of the silver image and at least one compound that improves the ink-repelling characteristics of the hydrophilic surface.

Suitable ingredients for the finisher are e.g. organic compounds containing a mercapto group such as the hydrophobizing compounds referred to hereinbefore for the alkaline solution. Preferred compounds correspond to one of the following formulas:

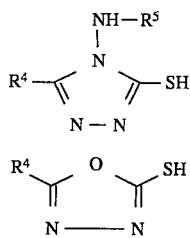

wherein $R^5$ represents hydrogen or an acyl group, $R^4$ represents alkyl, aryl or aralkyl. Most preferably used compounds are compounds according to one of the above formulas wherein $R^4$ represents an alkyl containing 3 to 16 C-atoms. Said (a) hydrophobizing agent(s) is(are) comprised in the finisher preferably in a total concentration between 0.1 g/l and 10 g/l, more preferably in a total concentration between 0.3 g/l and 3 g/l.

Additives improving the oleophilic ink-repellency of the hydrophilic surface areas are e.g. carbohydrates such as acid polysaccharides like gum arabic, carboxymethylcellulose, sodium alginate, propylene glycol ester of alginic acid, hydroxyethyl starch, dextrin, hydroxyethylcellulose, polyvinyl pyrrolidone, polystyrene sulphonic acid, and polyvinyl alcohol.

Said additives are preferably polyglycols, being the reaction products of ethyleneoxide and/or propyleneoxide with water or an alcohol. Particularly preferred polyglycols are polyethyleneglycols wherein the number of ethyleneoxide groups is comprised between 30 and 100. Preferably said polyglycols are present in the finisher in a total amount between 50 g/l and 150 g/l.

Optionally, hygroscopic substances e.g. sorbitol, glycerol, tri(hydroxyethyl)ester of glycerol, and turkey red oil may be added.

Furthermore (a) surface-active compound(s) is preferably also added to the finisher in an amount between 100 mg/l and 2.5 g/l Preferred surface-active compound are anionic or non-ionic surface-active compound.

At the moment the treatment with the finisher is started the exposed imaged surface of the support may be in dry or in wet state. In general, the treatment with the finisher, having preferably a temperature between 30° C. and 60° C., more preferably between 40°and 50° C. does not take long, usually not longer than about 30 seconds. It may be carried out immediately after the processing and uncovering steps or at a later stage, but before the plate is used for printing.

The finisher can be applied in different ways such as by rubbing with a roller, by wiping with an absorbent means e.g. with a plug of cotton or sponge or by dipping the material to be treated in the finisher. Preferably, the finisher is applied automatically by conducting the printing plate through a device having a narrow channel filled with the finisher. usually conveying the printing plate at the end of the channel between two squeezing rollers removing the excess of liquid.

As soon as the hydrophilic surface of the support carrying the silver image has been treated with the finisher, it is in most cases ready to be used as a printing plate. Alternatively, in stead of or after the treatment with a finisher, said hydrophilic surface of the support may be treated with an etch.

The lithographic composition often called etch comprises at least one compound enhancing the ink-receptivity and/or lacquer-receptivity of the silver image, at least one compound that improves the ink-repelling characteristics of the hydrophilic surface and a compound capable of oxidizing a silver mirror.

Suitable ingredients for the finisher are e.g. organic compounds containing a mercapto group such as the hydrophobizing compounds referred to hereinbefore for the alkaline solution.

Additives improving the oleophilic ink-repellency of the hydrophilic surface areas are e.g. ethyleneglycol monoesters and the compounds mentioned above as suitable compounds in a finisher for said function.

Compounds capable of oxidizing a silver mirror are preferably ferric salts, more preferably alkali salts of ferricyanide or of ferri-ethylene diamine tetraacetic acid.

The invention will now be illustrated by the following examples without however the intention to limit the invention thereto. All parts are by weight unless otherwise specified.

EXAMPLE 1

Comparative example

Preparation of imaging element 1.
Preparation of the image receiving element.

A 0,30 mm thick aluminum foil (AA 1050) was degreased, etched, electrochemically grained to form a surface topography with an average center-line roughness Ra of 0,6 μm, subsequently subjected to anodic oxidation in a 20% sulfuric acid aqueous solution to form an anodic oxidation film of 3.0 g/m² of $Al_2O_3 \cdot H_2O$, treated with an aqueous solution containing 20 g/l of $NaHCO_3$ at 45° C. for 30 sec and then rinsed with demineralised water and dried. The image receiving element was obtained by coating the grained, anodized and sealed aluminum support with a silver-receptive stratum containing 1.1 mg/m² PdS as physical development nuclei.

Preparation of the photosensitive layer packet.

On a temporary base (a polyethylene terephtalate film of 0.1 mm thickness, coated with a subbing layer comprising a copolymer of crotonic acid and vinylacetate in a molar ratio of 5:95) was coated a substantially unhardened photosensitive negative-working cadmium-free gelatin silver chlorobromoiodide emulsion layer (97.98 /2/0.02 mol %) containing 1 mmole/mole AgX of 4-hydroxy-6-methyl-1,3,3a,7-tetraazaindene, the silver halide being provided in an amount corresponding to 2.40 g of silver nitrate per $m^2$ and the gelatin content of the emulsion layer being 1.58 $g/m^2$, consisting of 0.7 $g/m^2$ of a gelatin with a viscosity of 21 mPa.s and the remainder of a gelatin with a viscosity of 14 mPa.s.

An intermediate layer was then provided on the emulsion layer from an aqueous composition in such a way that the resulting dried layer had a weight of 0.5 g of polymethyl methacrylate beads per $m^2$, said composition comprising:

| | |
|---|---|
| a 20 % dispersion of polymethyl methacrylate beads in a mixture of equal volumes of water and ethanol having an average diameter of 1.0 μm | 50 ml |
| Helioechtpapierrot BL (trade mark for a dye sold by BAYER AG, D-5090 Leverkusen, West-Germany) | 2.5 g |
| saponine | 2.5 g |
| sodium oleylmethyltauride | 1.25 g |
| demineralized water (pH-value:5.6) | 300 ml |

Finally the thus formed photosensitive layer packet is pressed with its intermediate layer side against said image receiving layer, which has been wet with water at 1 $g/m^2$. The temporary base is then removed and the obtained imaging element is dried at 45° C. for 20 s. Preparation of imaging element 2.

This imaging element was prepared in an identical way as imaging element 1 with the exception that the temporary layer was first coated with a barrier layer comprising 1.5 $g/m^2$ of gelatin before coating the emulsion layer.

The imaging elements 1 and 2 were exposed through a contact screen in a process-camera and immersed for 10 s at 24° C. in a freshly made developing solution having the following ingredients:

| | |
|---|---|
| carboxymethylcellulose | 4 g |
| sodium hydroxide | 22.5 g |
| anhydrous sodium sulphite | 120 g |
| hydroquinone | 20 g |
| 1-phenyl-3-pyrazolidinone | 6 g |
| potassium bromide | 0.75 g |
| anhydrous sodium thiosulphate | 8 g |
| ethylene diamine tetraacetic acid tetrasodium salt | 2 g |
| demineralized water to make | 1000 ml |
| pH (24° C.) = 13 | |

The initiated diffusion transfer was allowed to continue for 30 s to form a silver image in the image receiving layer.

To remove the developed silver halide emulsion layer and the intermediate layer from the aluminum foil the developed monosheet DTR materials were rinsed for 6 s with a water jet at 40° C.

Next, the imaged surfaces of the aluminum foils were guided for 15 s through a finisher having a temperature of 45° C. to enhance the water-receptivity of the non-image areas and to make the image areas oleophilic ink-receptive. The finisher had the following composition:

| | |
|---|---|
| AKYPO-OP-80 (trade mark for a surfactant sold by Chemische Fabrik Chem-Y, Gmbh, Germany) | 250 mg |
| $NaH_2PO_4.2H_2O$ | 20.0 g |
| potassium nitrate | 12.5 g |
| citric acid | 20.0 g |
| 2-mercapto-5-n.heptyl-oxa-3,4-diazole | 0.5 g |
| Polyethyleneglycol 3000 | 75.0 g |
| sodium hydroxide | 5.5 g |
| water to make | 1000 ml |
| pH (20° C.) = 6 | |

The silver, deposited in the image areas of the lithographic printing plate obtained by exposing and processing the imaging element 1 (comparison element) amounted to 1.03 $g/m^2$ while this amounted to a substantially higher 1.19 $g/m^2$ for the lithographic printing plate obtained by exposing and processing the imaging element 2 (element according to the invention).

The printing plates were mounted on the same offset printing machine (HEIDELBERG GTO-46) and were used for printing under identical conditions. A mixture of AQUA TAME 7035E at a 3% concentration and AQUA AYDE 7022A at a 4% concentration, both marketed by Anchor/Lithemko Inc., Florida, USA was used in an aqueous solution containing 10% isopropanol as dampening solution and K+E 171, marketed by Kast+Ehinger. A.G., Germany was used as ink. A compressible rubber blanket was used.

Copies of good quality were obtained from both printing plates. However, the printing endurance (the number of copies that can be printed from one printing plate with an acceptable printing quality) was lower for the printing plate obtained by exposing and processing the imaging element 1 (comparaison element) than for the printing plate obtained by exposing and processing the imaging element 2 (element according to the invention).

EXAMPLE 2

Comparative example

Preparation of imaging element 3.

This imaging element was prepared in an identical way as imaging element 1 with the exception that the emulsion layer contained 0.25 $g/m^2$ of 1-phenyl-4-methyl-4-hydroxymethyl-3-pyrazolidone and the intermediate layer contained 0.36 $g/m^2$ of hydroquinone.
Preparation of imaging element 4.

This imaging element was prepared in an identical way as imaging element 1 with the exception that the emulsion layer contained 0.25 $g/m^2$ of 1-phenyl-4-methyl-4-hydroxymethyl-3-pyrazolidone and 0.36 $g/m^2$ of hydroquinone.
Preparation of imaging element 5.

This imaging element was prepared in an identical way as imaging element 2 with the exception that the emulsion layer contained 0.25 $g/m^2$ of 1-phenyl-4-methyl-4-hydroxymethyl-3-pyrazolidone and 0.36 $g/m^2$ of hydroquinone.
Evaluation.

When measuring the amount of silver halide emulsion (expressed as g $AgNO_3/m^2$) transferred during the laminating step from the temporary base to the image receiving element, the result for imaging element 3 is 1.55 g $AgNO_3/m^2$, for imaging element 4 is 0.10 g $AgNO_3/m^2$ and for imaging element 5 is 2.39 g $AgNO_3/m^2$. From these results, it is clear that when preparing the imaging elements 3 or 4

(comparison elements) by laminating the emulsion layer from a temporary base to the permanent base a substantial amount or even almost all of the emulsion layer remains on the temporary base while when preparing the imaging elements B (element according to The invention) by the identical procedure nothing of the emulsion layer remains on the temporary base Said imaging element 5 was exposed through a contact screen in a process-camera and immersed for 10 s at 24° C. in a freshly made activator having the following ingredients:

| | |
|---|---|
| carboxymethylcellulose | 4 g |
| sodium hydroxide | 22.5 g |
| anhydrous sodium sulphite | 30 g |
| $Al_2(SO_4)_3.18H_2O$ | 8 g |
| Aminoethyl-aminoethanol | 30 ml |
| 4-allyl-1.2.4-triazolium-3-thiolate | 1.1 g |
| ethylene diamine tetraacetic acid tetrasodium salt | 2 g |
| demineralized water to make | 1000 ml |
| pH (24° C.) = 13 | |

The initiated diffusion transfer was allowed to continue for 30 s to form a silver image in the image receiving layer.

To remove the developed silver halide emulsion layer and the intermediate layer from the aluminum foil the developed monosheet DTR material was rinsed for 6 s with a water jet at 40° C.

Next, the imaged surface of the aluminum foil was guided for 15 s through a finisher having a temperature of 45° C. to enhance the water-receptivity of the non-image areas and to make the image areas oleophilic ink-receptive. The finisher had the following composition:

| | |
|---|---|
| AKYPO-OP-80 (trade mark for a surfactant sold by Chemische Fabrik Chem-Y. Gmbh, Germany) | 250 mg |
| $NaH_2PO_4.2H_2O$ | 20.0 g |
| potassium nitrate | 12.5 g |
| citric acid | 20.0 g |
| 2-mercapto-5-n.heptyl-oxa-3,4-diazole | 0.5 g |
| Polyethyleneglycol 3000 | 75.0 g |
| sodium hydroxide | 5.5 g |
| water to make | 1000 ml |
| pH (20° C.) = 6 | |

Next, the imaged surface of the aluminum foil was wiped with a sponge with an etch solution with the following composition:

| | |
|---|---|
| $Na_3PO_4.12H_2O$ | 40.0 |
| sodium nitriteate | 5.0 g |
| potassium ferricyanide | 98.0 g |
| tributylphosphate | 1.0 ml |
| ethyleneglycol monoacetate | 100.0 ml |
| n-propanol | 150.0 ml |
| 1-allyl-2-imidazolidine thione | 5.2 g |
| methoxypropanol | 52.0 ml |
| water to make | 1000 ml |
| pH (20° C.) = 11.2 | |

The printing plate was mounted on a R35 ROTAPRINT printing machine. ROTAMATIC FOUNTAIN SOLUTION at a 3% concentration was used in an aqueous solution containing 10% isopropanol as dampening solution and K+E 123 W was used as ink. A compressible rubber blanket was used.

Copies of good quality were obtained after 10 prints.

We claim:

1. A method for obtaining an imaging element suitable for use in a silver salt diffusion transfer process by the steps of:

preparing an image receiving element by coating the anodized surface of an aluminum foil with an image-receiving layer comprising physical development nuclei, preparing a photosensitive layer packet by coating a temporary base with at least one photosensitive silver halide emulsion layer, pressing the thus formed photosensitive layer packet with its photosensitive silver halide emulsion coated side against said image receiving layer, which has been wet with an aqueous moistening liquid, and optionally removing said temporary base, characterized in that between said temporary base and said at least one photosensitive silver halide emulsion layer a barrier layer is present which comprises gelatin as hydrophilic binder, is substantially free of developing agents, is substantially unhardened, comprises one or more hydrophilic binders in an amount of at least 0.25 g/m$^2$ and is in water permeable relationship with said image receiving layer.

2. A method according to claim 1 wherein said barrier layer contains less than 0.05 g/m$^2$ of developing agents.

3. A method according to claim 1 wherein said barrier layer comprises one or more hydrophilic binders in an amount of at least 0.5 g/m$^2$.

4. A method according to claim 1 wherein is coated as upper layer of the photosensitive layer packet an intermediate layer, said intermediate layer being a water-swellable layer coated at a ratio of 0.01 to 2.0 g/m$^2$ and comprising at least one non-proteinic hydrophilic film-forming polymer or being a layer comprising hydrophobic polymer beads having an average diameter not lower than 0.2 μm and having been prepared by polymerization of at least one ethylenically unsaturated monomer.

5. A method according to claim 1 wherein said temporary base is a cellulose triacetate or polyethylene terephtalate film base coated with a subbing layer comprising a copolymer of crotonic acid and vinylacetate in a molar ratio between 2:98 and 10:90.

6. A method according to claim 1 wherein said photosensitive layer packet comprises a developing agent.

7. A method according to claim 1 wherein said developing agent is comprised in the emulsion layer or in the intermediate layer.

\* \* \* \* \*